United States Patent
Mullen et al.

(10) Patent No.: US 7,081,753 B2
(45) Date of Patent: Jul. 25, 2006

(54) MULTIPLE TUNED SCROLL COIL

(75) Inventors: Charles G. Mullen, Fort Collins, CO (US); John A. Stringer, Longmont, CO (US); Knut G. Mehr, San Francisco, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/899,830

(22) Filed: Jul. 26, 2004

(65) Prior Publication Data

US 2006/0017438 A1    Jan. 26, 2006

(51) Int. Cl.
*G01V 3/00* (2006.01)
(52) U.S. Cl. .................. 324/318; 324/321; 324/322
(58) Field of Classification Search ............... None
See application file for complete search history.

(56) References Cited

U.S. PATENT DOCUMENTS

| | | | | |
|---|---|---|---|---|
| 3,569,823 | A * | 3/1971 | Golay | 324/320 |
| 5,162,739 | A * | 11/1992 | Doty | 324/322 |
| 5,180,982 | A * | 1/1993 | Zeiger | 324/322 |
| 5,243,289 | A * | 9/1993 | Blum et al. | 324/322 |
| 5,424,645 | A * | 6/1995 | Doty | 324/318 |
| 5,555,251 | A * | 9/1996 | Kinanen | 324/319 |
| 5,680,086 | A * | 10/1997 | Allis et al. | 335/296 |
| 6,081,120 | A * | 6/2000 | Shen | 324/318 |
| 6,087,832 | A * | 7/2000 | Doty | 324/318 |
| 6,307,371 | B1 * | 10/2001 | Zeiger | 324/318 |
| 6,380,742 | B1 | 4/2002 | Stringer et al. | |
| 6,590,394 | B1 * | 7/2003 | Wong et al. | 324/318 |
| 6,617,851 | B1 * | 9/2003 | Bergmann | 324/318 |
| 6,670,811 | B1 * | 12/2003 | Wind et al. | 324/307 |
| 6,794,874 | B1 * | 9/2004 | Hasegawa | 324/322 |
| 6,933,722 | B1 * | 8/2005 | Tsuda et al. | 324/318 |
| 2003/0085706 | A1 * | 5/2003 | Hasegawa | 324/322 |
| 2004/0251901 | A1 * | 12/2004 | Tsuda et al. | 324/318 |
| 2006/0017438 | A1 * | 1/2006 | Mullen et al. | 324/318 |

OTHER PUBLICATIONS

Gimi B et al article "Investigation of NMR signal-to-noise ratio for RF scroll microcoils" 1st Annual International IEEE-EMBS Special Topic Conference on Microtechnologies in Medicine and Biology, USA 2000, pp. 88-91.*

Grant et al., article "Analysis of Multilayer Radio Frequency Microcoils for Nuclear Magnetic Resonance Spectroscopy", Jul. 2001, IEEE Transactions on Magnetics, pp. 2989-2998.*

(Continued)

*Primary Examiner*—Diego Gutierrez
*Assistant Examiner*—Tiffany A. Fetzner
(74) *Attorney, Agent, or Firm*—Bella Fishman; David Gloekler

(57) ABSTRACT

A sample probe and apparatus are provided for magnetic resonance experiments. The probe includes a coil simultaneously tunable to at least two different frequencies. The coil includes a section having a scroll configuration and defines a core into which a sample can be inserted. A multi-resonant circuit transmits RF energy to the coil at two or more different frequencies for exciting nuclei of the sample. The apparatus includes a coil having a scroll configuration. RF transmission circuitry transmits RF energy to the coil at two or more different frequencies. RF receiving circuitry receives an RF signal responsive to excitation. A coil is magnetically coupled with a sample at an RF frequency.

19 Claims, 12 Drawing Sheets

OTHER PUBLICATIONS

Stringer et al., article "Reduction of RF-induced sample heating with a scroll coil resonator structure for solid-state NMR probes" Journal of Magnetic Resonance 173 (2005) pp. 40-48.*

Article by Koskinen, et al., entitled The Concentric Loop-Gap Resonator-A Compact, Broadly Tunable Design for NMR Applications, published by Journal of Magnetic Resonance, 98, pp. 576-588, 1992.

Article by Gimi, et al., entitled "Investigation of NMR Signal-to-Noise Ratio for RF Scroll Microcoils", published by 1st Annual International IEEE-EMBS Special Topic Conference on Microtechnologies in Medicine & Biology, Oct. 12-14, 2000).

Article by Wiltshire, et al., entitled Microstructured Magnetic Materials for Radio Frequency Operation in Magnetic Resonance Imaging (MRI), submitted to Science on Dec. 10, 2000.

* cited by examiner

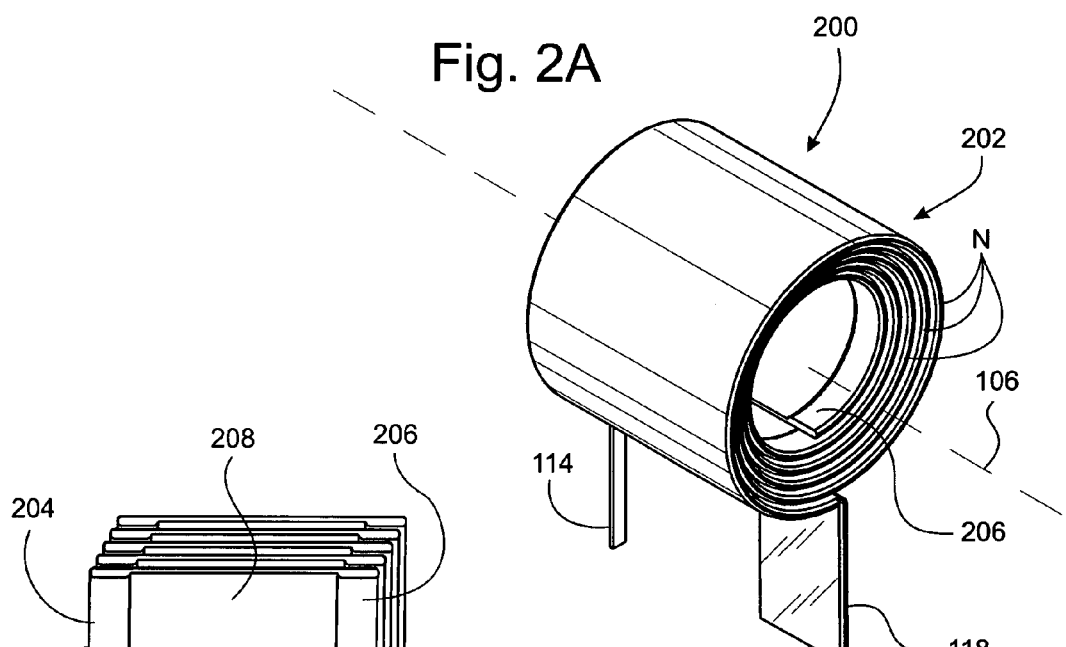
Fig. 2A
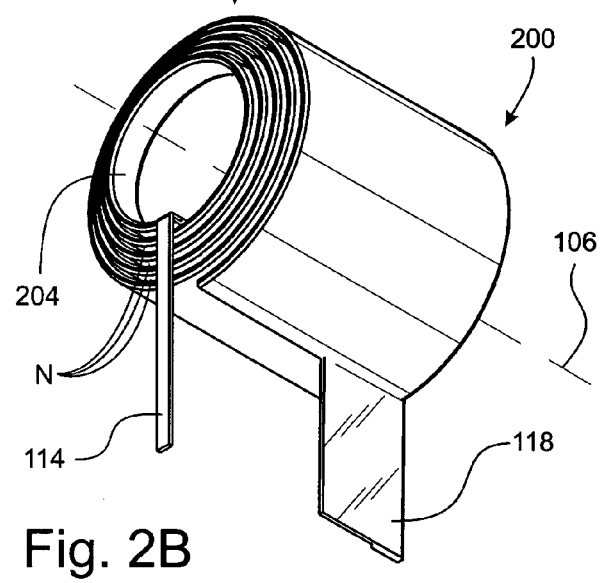
Fig. 2C
Fig. 2B

MULTIPLE TUNED SCROLL COIL

FIELD OF THE DISCLOSURE

The present invention relates generally to the study of analytes by techniques based on magnetic resonance such as, for example, nuclear magnetic resonance (NMR) spectroscopy and microscopy. More particularly, the present invention relates to the use in such techniques of a scroll coil for transmitting RF energy to a sample containing analytes and receiving RF energy from the sample.

BACKGROUND OF THE DISCLOSURE

Studies based on nuclear magnetic resonance (NMR) entail the application of a magnetic field $B_1$ oscillating in the radio-frequency (RF) range (i.e., approximately 4–900 MHz) to a sample while the sample is subjected to an external, static magnetic field $B_0$ that is much stronger (typically two or more orders of magnitude) than the $B_1$ field. If a resonance condition is fulfilled, the relatively small periodic perturbation caused by the $B_1$ field can produce a large change in the orientation of the net magnetization of certain types of nuclei in the sample via transfer of electromagnetic energy. This phenomenon occurs because NMR-active nuclei, i.e., the types of nuclei responsive to NMR, possess the fundamental property of spin and can behave as magnetic dipoles. A spinning, charged nucleus creates a magnetic moment oriented along the axis of the spin. Commonly studied NMR-active nuclei include, but are not limited to, $^1H$ (a proton) and the isotopes $^{13}C$ (carbon-13), $^{19}F$ (fluorine-19), and $^{31}P$ (phosphorous-31). At a given instant of time, such nuclei are observed to exist in one of two magnetic quantum states, $m=+\frac{1}{2}$ (the lower energy state) and $m=-\frac{1}{2}$ (the higher energy state) and thus are termed spin-half nuclei (other nuclei with non-zero nuclear spins, but where $m \neq \pm \frac{1}{2}$, can also be studied; typical examples include $^2H$, $^{23}Na$, and $^{14}N$). If a nucleus of this type is subjected to a $B_0$ field, its magnetic moment becomes oriented in one of two directions relative to the direction of the $B_0$ field depending on its magnetic quantum state. For a positive $\gamma$, at the lower energy state corresponding to $m=+\frac{1}{2}$ the magnetic moment is aligned with the $B_0$ field, whereas at the higher energy state corresponding to $m=-\frac{1}{2}$ the magnetic moment opposes the $B_0$ field. The application of a $B_1$ field causes a transition between energy states if the frequency of the applied RF energy is at or near the Larmor (or resonance) frequency $\nu_0$ according to the expression $\nu_0=(\gamma B_0)/2\pi$. The $B_1$ field can be induced by current alternating at or near the resonance frequency and running through a transmitter coil that surrounds the sample. The resonance frequency thus depends on the strength of the polarizing magnetic field $B_0$ and the intrinsic properties of the nucleus as reflected in the proportionality constant $\gamma$, known as the gyromagnetic ratio of the nucleus. Different types of nuclei have different gyromagnetic ratios and thus, for a given $B_0$ field, require a different resonance frequency for excitation. A transition from a lower energy state to a higher energy state corresponds to absorption by a nucleus of electromagnetic energy, i.e., a photon whose energy $E=h\nu=h\gamma B_0/2\pi$ (where h is Plank's constant) matches the energy difference between the two states. A transition from a higher energy state to a lower energy states state corresponds to emission of electromagnetic energy by the nucleus.

In the presence of the applied $B_0$ field, NMR-active nuclei in the sample become oriented such that the lower energy state predominates and thus a net adsorption of electromagnetic energy exists. For a positive $\gamma$, the net magnetic field attributed to the magnetic moments of the nuclei, i.e., the bulk magnetization of the sample, points in the direction of the applied $B_0$ field. The relative excess of nuclei in the lower energy state is on the order of ppm (parts per million) and can be determined from Boltzmann statistics. The difference between the energy absorbed by nuclei transitioning from the lower energy state to the higher energy state, and the energy emitted by nuclei simultaneously transitioning from the higher energy state to the lower energy state, is manifested in an NMR response signal. That is, the NMR response signal is proportional to the population difference between the two energy states. In effect, the $B_1$ field is applied in such a way as to cause the magnetization vector to tilt away from the axis along which the $B_0$ field is directed (usually taken to be the z-axis) and to precess about the axis. This precession induces a current in a receiver coil surrounding the sample; in pulse NMR techniques, the same coil can be used as both the receiver coil and the transmitter coil. The current, or NMR response signal, detected by the coil can be amplified and processed to yield an NMR spectrum in the frequency domain. The spectrum consists of one or more peaks whose intensities represent the proportions of each frequency component present. The excess number of nuclei in the lower energy state increases with decreasing temperature and increases as a function of Boltzmann's constant ($e^{-\Delta E/KT}$) with increasing $B_0$ field strength. Hence, at a given temperature, the intensity of the NMR response signal derived from the excess increases linearly with increasing $B_0$ field strength. The frequency at which a nucleus can absorb RF energy is influenced by its local chemical environment (e.g., nearby electrons and nuclei). Commonly studied environmental effects include chemical shifts arising from ancillary magnetic fields created by circulation of electrons around nuclei, and spin-spin splitting arising from couplings between nearby nuclei. Thus, NMR spectra can provide useful information indicative of molecular structure, position, and quantity in chemical, biochemical, and biological species of interest.

Most modern NMR systems utilize a Fourier transform (FT) NMR spectrometer to provide the $B_1$ field and a magnet to provide the $B_0$ field. Although electromagnets and permanent magnets have been employed in the past, a superconducting magnet is preferred because it can produce a more powerful (typically on the order of several Tesla), homogeneous, and reproducible $B_0$ field. The superconducting magnet typically includes a solenoidal wire wound around a magnet bore and a cooling system such as a cryostat employing liquid-helium and liquid-nitrogen heat sinks to maintain the wire at the critical temperature required for superconductivity. If necessary, the system can include components for compensating for drift and inhomogeneity in the $B_0$ field generated by the magnet. Such components may include a field/frequency lock system that irradiates a reference nucleus such as deuterium to produce a reference signal for drift correction, and shim coils for offsetting spatial inhomogeneities in the $B_0$ field. A sample containing NMR-active nuclei to be investigated is held in a sample container and mounted in a sample probe within the magnet bore where the sample can be immersed in the $B_0$ field. RF electronics of the spectrometer supply RF energy to the transmitter coil located in the sample probe. The RF energy is supplied in the form of a pulse or a precisely controlled sequence of pulses that are prescribed according to the type of sample and the chosen parameters of the experiment, thereby inducing the transmitter coil to irradiate the sample with the appropriate $B_1$ field. Typically, the direction of the applied RF pulses is orthogonal to that of the main magnetic field $B_0$. If the resonance conditions are fulfilled for a given type of nucleus, the RF pulses excite the nucleus to a degree sufficient for detection. During the delay interval between pulses, the nucleus emits an RF time-domain signal, known as a free induction decay (FID) signal, which decays in the interval as the excited nucleus relaxes back to an equilibrium state. A separate coil can be used to detect the FID signal, but since the excitation pulse and FID occur during different time intervals, a single coil contained in the sample probe can function as both the transmitter and receiver as previously noted. Fourier transformation then converts the time-domain signal to a frequency-domain signal to produce an NMR spectrum interpretable by the researcher.

It can be appreciated that because the sample coil serves as the direct interface for the coupling of pulsed RF excitation and detection signals between the sample and the NMR system, the design and performance of the sample coil are critical. This is especially true in the case of a multi-tunable (or multi-resonant) coil that is capable of being tuned so as to transmit two or more resonant frequencies for independently exciting two or more different nuclei—i.e., multi-pulse, multinuclear, and multi-dimensional techniques in which nuclei of differing types (e.g., $^1H$ and $^{13}C$) and/or chemically non-equivalent nuclei of the same type are excited for such purposes as observation, decoupling, polarization transfer, etc.

Coils of conventional design include solenoid coils, saddle coils, loop-gap resonators, Hemholtz, birdcage, slotted tube (e.g., Alderman-Grant-style resonator), and combinations of two or more types of these coils. Each type of single-coil and multi-coil design has advantages and disadvantages and thus trade-offs among various performance-related factors have been unavoidable for the most part. Some of the merits and demerits of certain coil designs are summarized by Koskinen et al., "The Concentric Loop-Gap Resonator—A Compact, Broadly Tunable Design for NMR Applications," *J. Magnetic Resonance,* 98, 576–588 (1992).

A solenoid coil is prone to transferring an undesirably large amount of heat energy to the sample mounted in its core, which in practice limits the range of experiments available to the researcher, especially experiments performed at high frequency. Sample heating can be attributed, at least partially, to the fact that the solenoidal structure impresses a potential difference along its longitudinal axial length and hence also along the longitudinal axial length of the sample. Consequently, an energized solenoid coil creates non-conservative electrical fields in its core of significant strength. A sample inserted in the core is immersed in this electrical field. Sample heating can destroy or at least degrade a thermally labile sample. In addition, solenoid coils have required so called "balun" technology (see, e.g., U.S. Pat. No. 6,380,742, assigned to the assignee of the present disclosure) to optimize matching of $B_1$ field distributions for different nuclei, but nonetheless experience a shortened $B_1$ field for high-frequency operation (typically $^1H$) due to wavelength effects. In addition, all conventionally designed sample coils of a given size exhibit an RF field whose homogeneous region is less than optimal. This often means that the size of a sample to be irradiated by the sample coil is limited. For a given coil size, the result is lower sensitivity than would be realized if a greater amount of the sample could be exposed to the homogeneous portion of the field. In addition, many conventional sample coils have been designed to exhibit low inherent inductance to minimize electrical field coupling. Examples are loop-gap resonators and Alderman-Grant-style resonators. These coils are fundamentally limited to a single turn, resulting in a fixed and typically very low inductance. Unfortunately, this low inductance results in insufficient performance for low-frequency nuclei.

Multi-coil (typically dual-coil and triple-coil) designs have been developed to address many of the problems attending conventional single-coil designs, but present additional problems. One obvious problem relates to the fact that the sample probe must accommodate more than one sample coil and hence engenders mechanical and electrical challenges. For example, mechanical difficulties inhere in the design of sample probes that must be capable of spinning the sample, particularly when the angular velocity and/or the spinning angle must be precise, as well as the generation of artifacts contributed by vibrations and reliability issues. Electrical difficulties include the challenge of ameliorating unwanted couplings between the various coils or other parts of the RF circuitry.

It would therefore be desirable to provide a sample coil that combines advantages of single-coil and multi-coil designs while eliminating or at least reducing their disadvantages. For instance, it would be desirable to provide a sample coil that exhibits the relative technical simplicity of a single-coil designs as well as the substantially reduced electrical field coupling commonly only obtainable with relatively complex dual-coil designs. Moreover, it would be advantageous to provide a sample coil that produces a substantially larger homogeneous magnetic field for a given physical coil size and a better match of the $B_1$-field distributions for different nuclei even at very high frequencies, whereas conventional solenoidal designs, for example, are limited by wavelength effects and two-coil designs experience limitations due to the fundamental difference between the respective sizes and geometries of the two coils. In addition, it would be advantageous to provide a sample coil that inherently causes less sample heating, thus broadening the range of the types of samples that can be analyzed.

To address the foregoing problems, in whole or in part, and/or other problems that may have been observed by persons skilled in the art, the present disclosure provides sample coils exhibiting a scroll geometry, as described by way of exemplary implementations set forth below.

The utility of the scroll geometry for RF applications has, in limited extent, been preliminarily investigated. See Gimi et al., "Investigation of NMR Signal-to-Noise Ratio for RF Scroll Microcoils," *1st Annual International IEEE-EMBS Special Topic Conference on Microtechnologies in Medicine & Biology* (Oct. 12–14, 2000). These authors performed an NMR spectroscopy experiment on de-ionized water, utilizing a manually wrapped scroll coil tuned and matched to resonate at 500 MHz, an NMR magnet having a field strength of 11.75 T, and a 90-degree pulse. From these testing parameters, it appears that the authors performed a basic, single-resonance, proton NMR spectroscopy experiment. Moreover, the authors reported the occurrence of line-broadening in their resulting spectra, leading to their conclusion that scroll coils in their current state are not desirable for spectroscopy, as opposed to imaging for which considerations of spectral resolution are less restrictive. Wiltshire et al., "Microstructured Magnetic Materials for Radio Frequency Operation in Magnetic Resonance Imaging (MRI)," article submitted to Science (Dec. 10, 2000), reported using a bundle of "Swiss Rolls" as a flux-guiding medium in an MRI experiment. A solenoid detector coil tuned to 21.3 MHz was placed immediately below a water phantom, the bundle of "Swiss Rolls" was placed on the water phantom, and the object to be imaged was placed on the bundle. The bundle of "Swiss Rolls" was thus employed to couple the object to the solenoid detector coil. No suggestion was made that the "Swiss Roll" structure could itself be employed as a transmitting or receiving coil.

Therefore, an ongoing need exists for improved coil designs for transmitting and/or receiving RF signals in magnetic resonance-related processes, and particularly designs that overcome one or more of the disadvantages mentioned above or other disadvantages encountered in the art.

SUMMARY OF THE DISCLOSURE

In one aspect of the disclosure, a sample probe is provided for magnetic resonance experiments. According to one implementation, the probe comprises a coil simultaneously tunable to at least two different frequencies. The coil includes a section having a scroll configuration and defines a core into which a sample can be inserted. A multi-resonant circuit communicates with the coil for transmitting RF energy to the coil at two or more different frequencies for exciting nuclei of the sample.

In another aspect, a magnetic resonance apparatus is provided. According to one implementation, the apparatus comprises a coil simultaneously tunable to at least two different frequencies. The coil includes a section having a scroll configuration and defines a core into which a sample can be inserted. RF transmission circuitry communicates with the coil for transmitting RF energy to the coil at two or more different frequencies for exciting nuclei of the sample. RF receiving circuitry communicates with the coil for receiving an RF signal responsive to excitation.

In another aspect, a coil is provided for magnetically coupling with a sample at an RF frequency. The coil comprises a section having a scroll configuration and defines a core into which the sample can be inserted. The section having the scroll configuration includes a layer of electrically conductive material axially extending from a first end region, through a central region, and to a second end region. In one implementation, the layer has a greater thickness in the end regions than in the central region. In another implementation, the layer is folded in the end regions to give the greater thickness.

According to another aspect, a coil with a layer having a greater thickness in the end regions is part of a multiple-resonance circuit.

According to another aspect, a coil with a layer having a greater thickness in at least one of the end regions is provided in a sample probe.

According to another aspect, a coil with a layer having a greater thickness in at least one of the end regions is provided in a magnetic resonance apparatus.

BRIEF DESCRIPTION OF THE DRAWINGS

FIG. 2A is a perspective view of a scroll coil according to another implementation in which edges or ends are folded;

FIG. 2B is another perspective view of the scroll coil illustrated in FIG. 2A;

FIG. 2C is a view taken of a section of the scroll coil illustrated in FIGS. 2A and 2B from the perspective of a location inside a core of the scroll coil;

DETAILED DESCRIPTION OF THE DISCLOSURE

In general, the term "communicate" (e.g., a first component "communicates with" or "is in communication with" a second component) is used herein to indicate a structural, functional, mechanical, electrical, optical, magnetic or fluidic relationship between two or more components or elements. As such, the fact that one component is said to communicate with a second component is not intended to exclude the possibility that additional components may be present between, and/or operatively associated or engaged with, the first and second components.

The subject matter disclosed herein generally relates to inductive resonators that have a coiled geometry and, more specifically, a scroll geometry as opposed to a traditional solenoidal (i.e., helical) or other geometry. In cooperation with appropriate RF circuitry, a scroll coil as described below can be employed to transmit and receive RF oscillating signals to and from a sample known to contain or suspected of containing analytes of interest that can be resolved in NMR spectra. The scroll coil may directly replace conventional coils in instruments based on magnetic resonance techniques and exhibits improved performance over conventional coils. In use, the scroll coil is compatible with a wide range of multi-pulse, multi-resonant, and multi-dimensional techniques. As a $B_1$-field generator, the scroll coil is efficient over a broad band of RF frequencies, including low frequencies, and thus the same scroll coil is well-suited for both proton and carbon-13 NMR applications, including solid-state experiments. The scroll coil exhibits substantially reduced sample heating as compared to conventional coils, and thus enables magnetic resonance-based investigations on a much broader range of analytical materials, particularly thermally labile biological compounds such as proteins, enzymes, and peptides. Examples of implementations of scroll coils and related devices, apparatus, and methods are described in more detail below with reference to FIGS. 1A–1I.

Figure 1A:
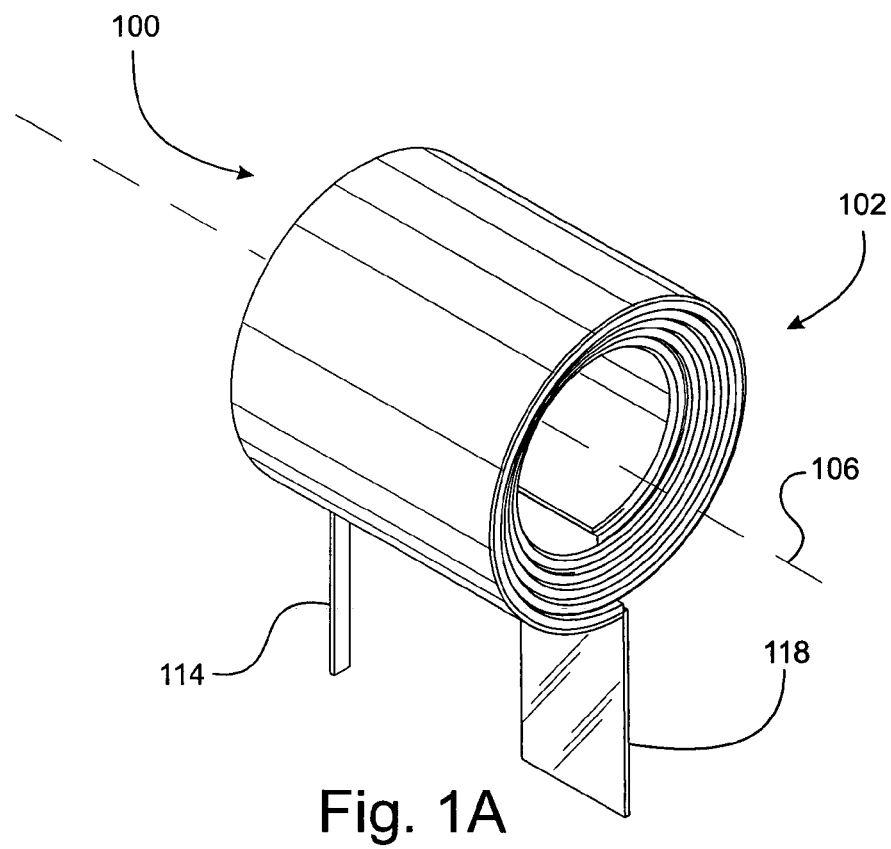
FIG. 1A is a perspective view of a scroll coil according to an implementation disclosed herein.
Figure 1B:
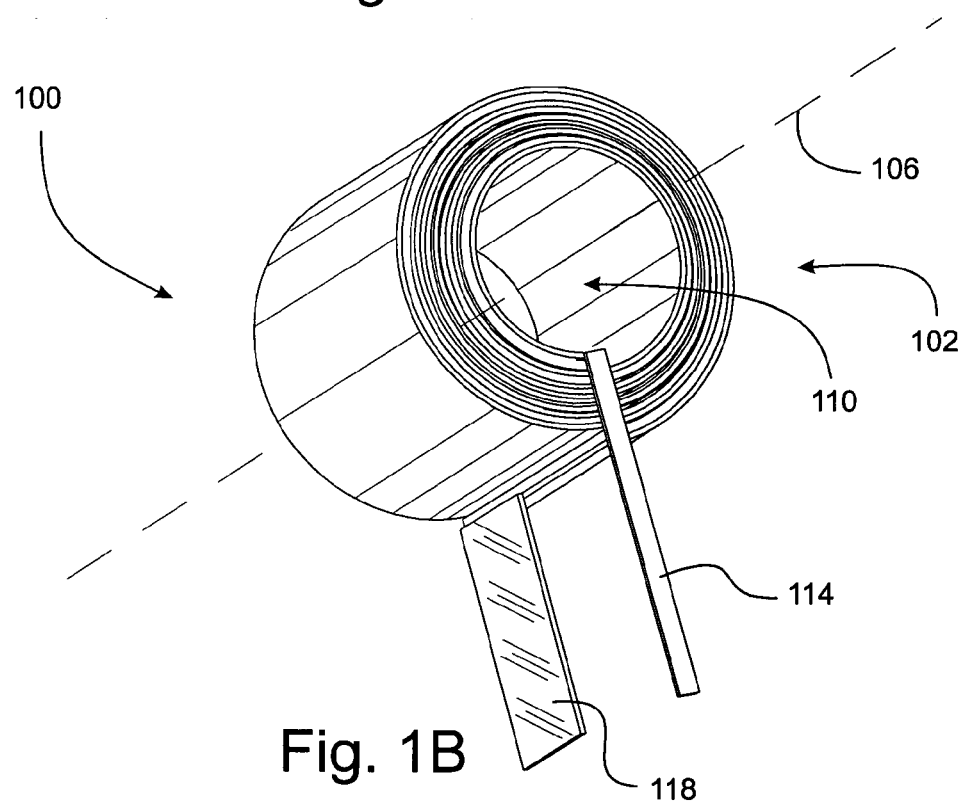
FIG. 1B is another perspective view of the scroll coil illustrated in FIG. 1A.
Figure 1C:
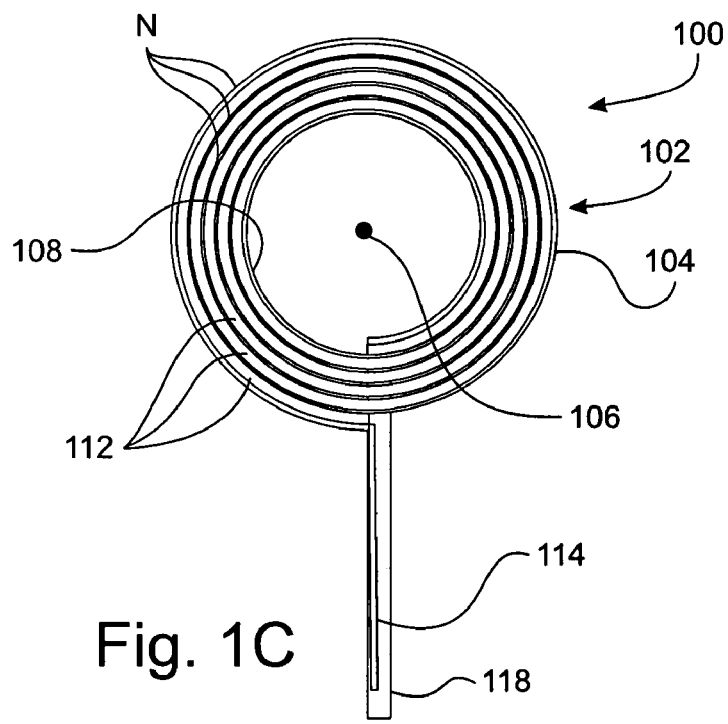
FIG. 1C is an end view of the scroll coil illustrated in FIGS. 1A and 1B.
Figure 1D:
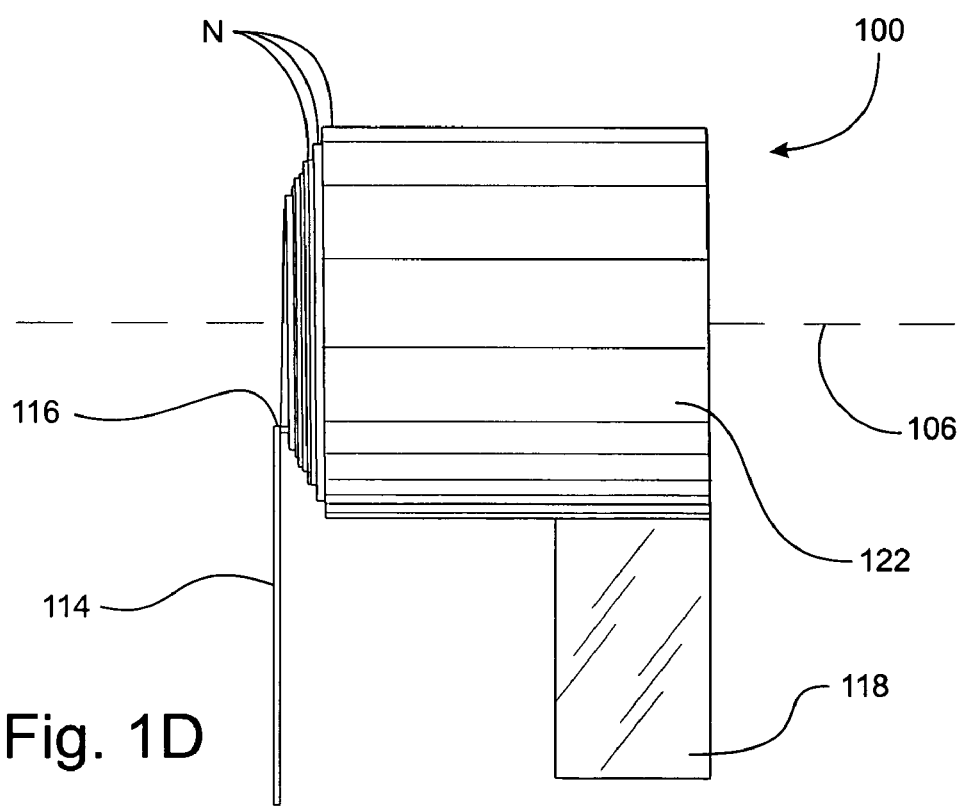
FIG. 1D is a side view of the scroll coil illustrated in FIGS. 1A–1C.

FIGS. 1A–1D illustrate various views of a scroll coil 100 according to one exemplary implementation. As best shown in the axial end view of FIG. 1C, scroll coil 100 includes a section 102 of coiled or scroll configuration defined by at least one planar body 104 (i.e., a sheet, foil, layer, etc.) of an electrically conductive material wrapped about a central, longitudinal axis 106 of scroll coil 100 by a number of (one or more) turns or wraps N. As a result, scroll section 102 includes wraps N of conductive material circumferentially extending about coil axis 106 and longitudinally extending between the axial ends of scroll coil 100. While the example illustrated in FIGS. 1A–1D comprises a 6-turn or 6-wrap scroll coil 100, the present disclosure as a general matter is not limited by the number of wraps or partial wraps N. It may be found in practice, however, that a preferred range for the number of wraps N may be specified depending on the particular application or operating parameters. In the illustrated example, the conductive material is continuous and forms a spiral running coaxially about coil axis 106. An innermost diameter 108 of coiled region 102 defines an open core 110 of scroll coil 100 into which a sample and any sample container retaining the sample can be inserted for irradiation and/or detection by scroll coil 100. The composition of the conductive material can be any material suitable for conducting electrical current and inducing an RF magnetic field for distribution to a sample inserted in coil core 110. A suitable conductive material may include, but is not limited to, copper. Gaps or annular spacings 112 are defined between adjacent wraps N of scroll coil 100. These annular spacings 112 may be air gaps or alternatively may be partially or wholly filled by a solid dielectric material. As best shown in FIG. 1D, scroll coil 100 can further include a conductive lead element 114 adjoined to an innermost wrap 116 and a conductive lead element 118 adjoined to an outermost wrap 122. Conductive lead elements 114 and 118 provide communication between scroll coil 100 and associated RF circuitry for the transmission of RF signals to the sample and/or reception of RF signals from the sample. Conductive lead elements 114 and 118 may be formed from the continuous layer of material employed to create coiled region 102.

At present, scroll coil 100 is not limited by any particular method of fabrication, and thus any method of fabrication found suitable by persons skilled in the art may be implemented. Coil core 110, for example, may be defined by wrapping conductive material about a coil former. In addition, it is desirable that the concentricity of the wraps N of scroll coil 100, i.e., the annular spacings 112 between adjacent wraps N, be maintained such that each wrap N does not contact another wrap N. For this purpose, it may be advisable to include a filler material between the wraps N that at least serves as a backing for the conductive material during the process of winding the conductive material about coil axis 106 during manufacture, thereby assisting in maintaining annular spacings N. However, unless it is desired that the filler material be retained to function as a dielectric layer, the filler material may by removed after scroll coil 100 has been formed. Depending on the desired size of scroll coil 100, well-known microfabrication techniques may be employed.

FIGS. 2A–2C illustrate another example of an implementation of a scroll coil 200 that differs from scroll coil 100 of FIGS. 1A–1D in its section 202 of coiled or scroll configuration, and primarily at a first axial end or edge region 204 and a second, opposing axial end or edge region 206. At end regions 204 and 206, the thickness of the conductive material (in the radial direction, relative to coil axis 106) is increased as compared with the thickness in a center region 208 between end regions 204 and 206. To preserve symmetry, it is advantageous that the increased thickness be present along each wrap N of the scroll geometry. Any suitable method can be employed to increase the thickness of the material in end regions 204 and 206. As one non-limiting example, the layer of conductive material may be folded back over itself to substantially double the thickness at one or both end regions 204 and 206. This has the effect of reducing the coil volume in the regions of increased thickness as compared with the region in the center. Consequently, the RF magnetic field is increased in the regions where the coil volume is reduced. As discussed below in conjunction with FIG. 9, the configuration of scroll coil 200 may be utilized to compensate for lower RF field intensity that might be observed at one or both ends of the "flat" configuration of scroll coil 100. In other words, folding the ends of one or more wraps N can result in an improvement in overall, end-to-end RF field homogeneity. In one implementation, after folding, an air gap may exist between the folded portion and the remaining portion of the material. In another implementation, no appreciable air gap is present.

Implementations of scroll coils such as scroll coils 100 and 200 described above in connection with FIGS. 1A–2C can offer advantages over coils of conventional design. Unlike solenoidal coils, the structure of scroll coils 100 and 200 offers a substantial reduction in non-conservative electrical fields in the sample. For scroll coils 100 and 200, the strength of the electrical fields in coil core 110 is at or near zero. Accordingly, scroll coils 100 and 200 enable a class of experiments, particularly at high frequencies, that have previously been unavailable when utilizing solenoid coils due to an inherent risk of sample destruction. As one example, scroll coils 100 and 200 are compatible with experiments on a wide variety of biological samples including bio-solids; for example, the study of hydrated high-salt (>200 mM) protein samples at very high $B_0$ fields. Moreover, the structure of scroll coils 100 and 200 lends itself to tuning shifts of 0.5% or less of the resonant frequency when filling the active sample volume. In addition, the RF circuit Q remains relatively unchanged, also deviating less than 0.5%, and thus scroll coils 100 and 200 can maintain constant RF circuit performance between different types of samples.

The compact size of scroll coils 100 and 200 lends itself to fitting into small spinning modules. In addition, as illustrated for example in FIG. 4, the RF magnetic $B_1$ field induced by scroll coils 100 and 200 is oriented along the longitudinal coil axis 106 as in the case of a solenoid coil. Consequently, a scroll coil 100 or 200 can directly replace the solenoid coil in a given sample probe. For example, the size of a standard 3.2 mm solenoid coil at a length of 6 mm and a wire diameter of 1 mm will have an outer diameter of 5–6 mm considering the clearance between the rotor and the coil. A 5-turn scroll coil can directly replace this solenoid with a 6 mm length and 5–6 mm outer diameter considering a 0.01 mm thickness of the copper and a 0.011 thickness of the dielectric (air or solid).

Moreover, the performance of scroll coils 100 and 200 does not suffer from fundamental wavelength limitations as in the case of the solenoid coil. For example, when scroll coil 100 or 200 is employed, fundamental wavelength limitations do not impair the matching of $B_1$ fields at higher $B_0$ field strengths as is critical, for example, in cross-polarization (CP) experiments. By contrast, solenoid coils have required balun technology (see, e.g., U.S. Pat. No. 6,380,742, assigned to the assignee of the present disclosure) to optimize field matching but nonetheless experience a shortened $B_1$ field for high-frequency operation (typically $^1H$) due to wavelength effects.

In addition, scroll coils 100 and 200 enable experimentation on larger active sample volumes for a given physical coil size due to the inherently larger homogeneous RF field. Because a larger amount of sample can reside in the active RF field, higher sensitivity is attained. Moreover, for sample probes capable of spinning samples, including MAS probes, the distance between the bearings of the stator of the probe can be reduced, which can enable a higher spinning speed for a given rotor diameter.

In addition, scroll coils 100 and 200 exhibit low-frequency efficiency of a degree competitive with traditional sample coils. Scroll coils 100 and 200 do not exhibit inherently low inductance and thus their performance is not limited by such condition. For instance, the efficiency of scroll coils 100 and 200 is not reduced when driven by a low-frequency channel or channels. Accordingly, scroll coils 100 and 200 allow for an optimization of the coil inductance to achieve a performance balance between high- and low-frequency channels. In this aspect, the performance of scroll coils 100 and 200 is comparable to solenoidal coil structures but is not attended by disadvantages associated with solenoidal coil designs, some of which are mentioned above. It will be noted that the low-frequency inductance of scroll coils 100 and 200 can be calculated by employing the standard formula for solenoid coils: $L(\text{in } \mu H) = (R^2 * N^2)/(9R + 10*Le)$, where R is the radius of the coil, N is the number of wraps of the scroll coil (as opposed to turns of a solenoid coil), and Le is the length of the coil.

In addition, the utilization of scroll coils 100 and 200 reduces or eliminates the mechanical and electrical difficulties attending multi-coil configurations. The utilization of scroll coils 100 and 200 results in a more efficient use of limited space, which is particularly critical for MAS applications, as well as reduced coupling between various parts of the circuit, gradient coils (if present) and the like, which is at least partially due to the inherently lower electrical field strength generated by scroll coils 100 and 200. The utilization of scroll coils 100 and 200 also results in increased mechanical reliability and reduced vibration artifacts.

Experimental results on scroll coils configured according to those illustrated in FIGS. 1A–2C are discussed below in connection with FIGS. 7–11.

Figure 3:
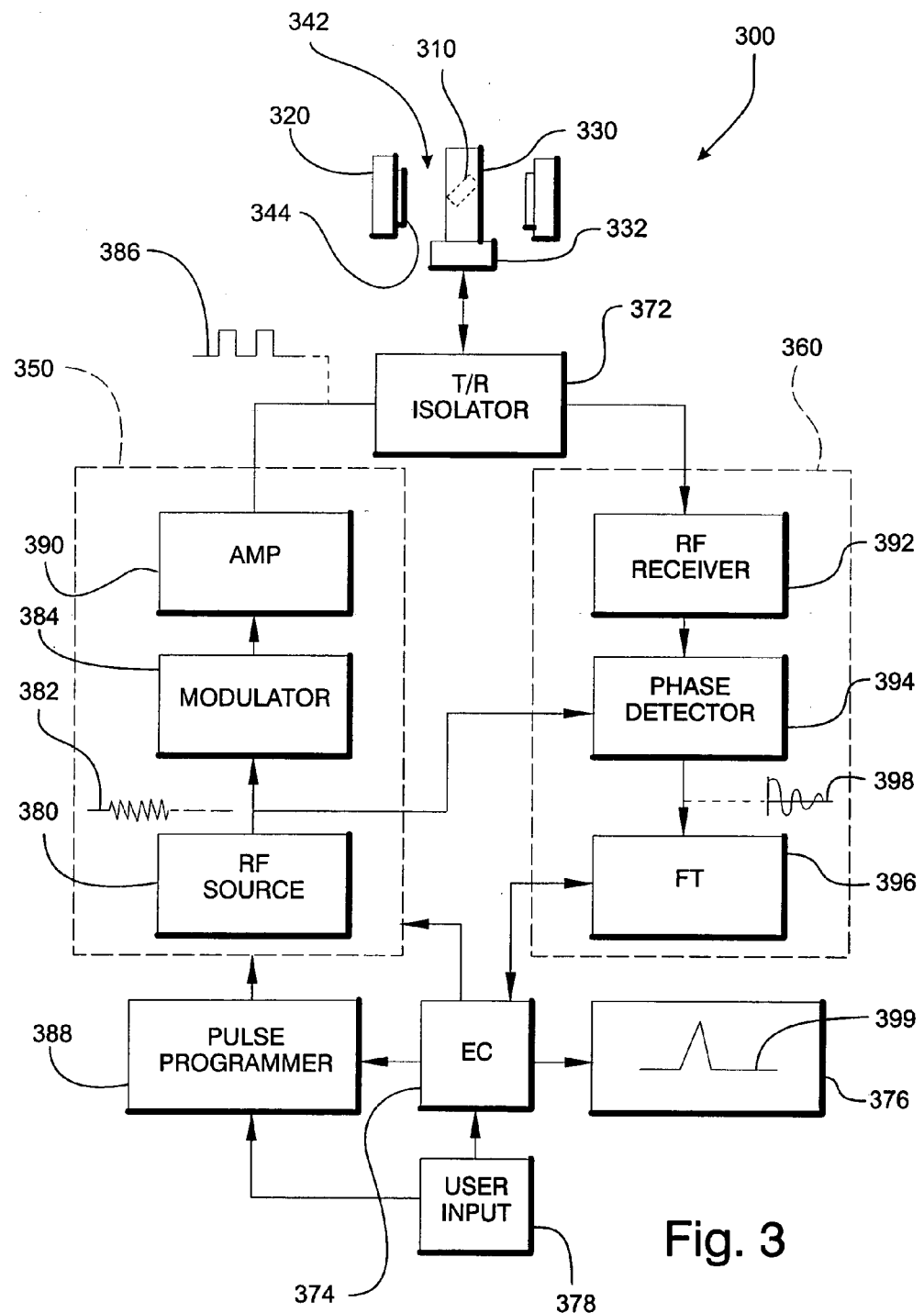
FIG. 3 is a schematic diagram representative of an example of a magnetic resonance-based apparatus or system in which the scroll coil as illustrated in FIGS. 1A–1D or FIG. 2 can operate.

FIG. 3 is a simplified schematic diagram illustrating an example of an apparatus or system operating on the phenomena of magnetic resonance, such as an NMR apparatus or system 300, in which scroll coils and associated sample probes may operate. For this purpose, a sample coil 310 is schematically depicted in FIGS. 3–6 to represent a coil exhibiting a scroll geometry similar to scroll coil 100 illustrated FIGS. 1A–1D or scroll coil 200 illustrated in FIGS. 2A–2C. Accordingly, sample coil 310 is intended to represent either scroll coil 100 or scroll coil 200.

Figure 4:
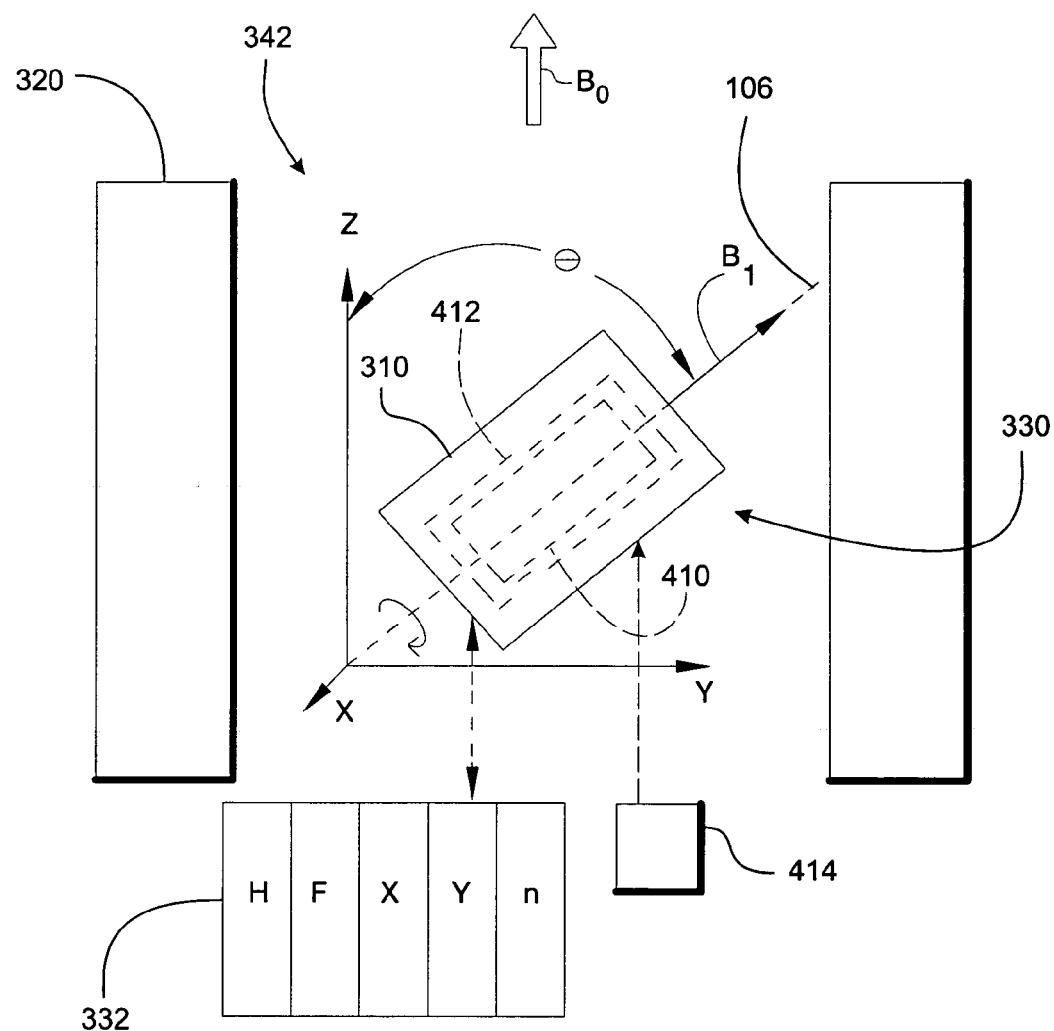
FIG. 4 is a schematic diagram representative of features of a sample probe in which the scroll coil as illustrated in FIGS. 1A–1D or FIG. 2 can operate.

In the example illustrated in FIG. 3, NMR apparatus 300 includes a magnet 320 for maintaining a polarizing magnetic $B_0$ field (FIG. 4). A sample 410 (FIG. 4) to be investigated is placed in a sample probe 330 positioned in a bore 342 of magnet 320 such that sample 410 can be immersed in the $B_0$ field. Sample 410 may be a liquid-phase (viscous or non-viscous), semi-solid phase (e.g., gel), solid-phase (including powder), or a multi-phase sample; sample coil 310 is compatible with both liquid-state and solid-state NMR. Shim coils 344 may also be placed in or near magnet bore 342 for correcting minor spatial inhomogeneities in the $B_0$ field.

Sample probe 330 may be structured to perform a number of functions, including supporting sample 410 in a specified orientation (including a container that holds sample 410 such as a tube or rotor, if applicable), as well as supporting sample coil 310. Sample coil 310 transmits RF magnetic $B_1$ excitation fields (FIG. 4) to sample 410 and receives RF detection signals from sample 410. In Fourier transform-based implementations where the $B_1$ fields are produced from an RF input pulse or pulse train and the RF detection signals are received during the time periods (delays) between input pulses, it is advantageous to employ a single sample coil 310 to perform both the transmitting and detecting functions. In other embodiments known as crossed-coil configurations, the transmitting and detecting functions can be respectively performed by separate coils. In most cases, however, a crossed-coil configuration is less preferred due to problems stemming from the more complex configuration and the need to suppress unwanted couplings or other interactions between separate coils. In either case, at least one sample coil 310 is characterized by the scroll geometry as described above. In some implementations, sample probe 330 typically contains a portion of the electronics by which RF input signals are fed to sample coil 310 and responsive RF output signals are picked up and carried by sample coil 310. The portion of the RF circuitry integrated in sample probe 330 is designated in this disclosure as a tunable circuit 332. Moreover, sample coil 310 with the scroll geometry is compatible with a tunable circuit 332 that is multiply-tunable or multiply-resonant.

NMR apparatus 300 further includes RF transmission circuitry 350, which may comprise any combination of components, devices, and circuits needed for generating RF energy and supplying RF excitation signals to sample coil 310 according to desired parameters (e.g., frequency, amplitude, phase, pulse width, and the like) for observation, decoupling, population inversion, providing control or reference signals, or any other function specified for a particular experiment. In addition, NMR apparatus 300 includes RF receiving circuitry 360, which may comprise any combination of components, devices, and circuits needed for receiving RF signals detected by sample coil 310 and processing these signals to generate a readily interpretable spectrum indicative of one or more attributes of the sample 410 under study. A transmitter/receiver isolating component 372 of suitable active or passive design, such as a multiplexer, diplexer, switch or the like, may be interfaced between sample probe 330 on one side and RF transmission circuitry 350 and RF receiving circuitry 360 on the other side. Particularly in the case of a single, tranceiving sample coil 310, transmitter/receiver isolating component 372 is typically employed to isolate the RF receiving components from the RF transmitting components, especially to protect the more sensitive detection elements of RF receiving circuitry 360 from the relatively more intense power supplied from the RF transmitting components. NMR apparatus 300 may include an electronic controller 374 of a suitable form that is equipped with hardware (e.g., microprocessor, memory, etc.) and/or software components, and which communicates with one or more components of RF transmission circuitry 350, RF receiving circuitry 360, transmitter/receiver isolating component 372 and/or sample probe 330 to control various operations of these components. All or part of electronic controller 374 may be embodied in a computer (e.g., a workstation, console, etc.) with input and output peripherals to enable interface with an operator of NMR apparatus 300. For example, electronic controller 374 may drive the operation of a readout or display device 376 that presents (e.g., via on-screen display, print-out, etc.) the NMR spectrum resulting from an experiment, as well as preparatory information such as relates to tuning and matching, on-screen menus and other information useful to an operator. Electronic controller 374 may accept user input from an input device 378 such as a keyboard, mouse, light pen, or the like. Electronic controller 374 may include data analysis software, databases, etc. in memory that aid the investigator in the interpretation of spectra.

As previously noted, RF transmission circuitry 350 can include any suitable combination of components, devices, and circuits needed for generating RF energy and supplying RF excitation signals to sample coil 310. In the example illustrated in FIG. 3, an RF source 380 such as RF generator or frequency synthesizer provides a stable source of RF frequency that can thereafter be modulated as needed. The source signal, generally depicted at 382, may be derived from a crystal oscillator internal to RF source 380 or electronic controller 374. The source signal is fed to modulating circuitry 384 that may represent a combination of functions such as pulsing (e.g., a gate or switch), attenuating, and phase shifting as needed to produce RF pulses of desired amplitude, delay, shape, phase, etc. as indicated at 386. The signal sequence may, for instance, be programmed by a pulse programmer 388 that controls the functions represented by modulator 384. Pulse programmer 388 may be embodied in hardware and/or software, and may constitute a part of electronic controller 374 or may be an independent component. For instance, a pulse program residing in the memory of electronic controller 374 may be loaded into pulse programmer 388 and then executed by pulse programmer 388. Pulse programmer 388 or electronic controller 374 may control transmitter/receiver isolating component 372 to coordinate the pulse sequence with the switching function of transmitter/receiver isolating component 372. An amplifier 390 can be utilized to boost the signal output of RF transmission circuitry 350 and thus properly set the $B_1$ field strength. The resulting RF signals are fed to sample probe 330 and distributed by sample coil 310 for irradiation of sample 410 (FIG. 4).

As also previously noted, RF receiving circuitry 360 can include any suitable combination of components, devices, and circuits needed for receiving RF signals detected by sample coil 310 and converting these signals to useful information. Accordingly, RF receiving circuitry 360 can include, for example, an RF receiver 392, a phase detector 394, and a Fourier transform analyzing component 396. The FID signals generated by sample 410 between pulses, as a result of well-known relaxation mechanisms by which nuclei tend toward equilibrium after perturbation, are picked up by sample coil 310, usually amplified and otherwise processed by RF receiver 392, and passed to phase detector 394. It will be noted that the first stage of RF receiving circuitry 360 may be a pre-amplifier (preferably a low-noise amplifier, or LNA, not shown) that is actually part of the circuitry 332 of sample probe 330. As appreciated by persons skilled in the art, phase detector 394 may have an advanced design for improved sensitivity and signal discrimination, such as a quadrature architecture that typically includes a combination of doubly balanced mixers (DBMs), filters, amplifiers, and a 90° phase shifter for accurately processing RF signals. For this purpose, RF source 380 may serve as a local oscillator to provide a carrier signal utilized by phase detector 394 in a known manner. The processed FID signal has a decaying, time-domain form generally depicted at 398. The FID signal is digitized and entered into Fourier transform analysis component 396, which may be embodied in software executed in electronic controller 374 or may be a separate component. Fourier transform analysis component 396 converts the time-domain FID signal to a frequency-domain signal as represented by the spectrum 399 shown with readout/display component 376 in FIG. 3.

FIG. 4 schematically illustrates sample 410 held in sample probe 330 in core 342 of magnet 320. Sample probe 330 may include components for spinning sample 410 about its axis (in the present implementation, the sample axis coincides with coil axis 106) to average out inhomogeneities and thus narrow spectral linewidth. Particularly for solid samples, sample probe 330 may be adapted to perform magic-angle spinning (MAS) to suppress line broadening due to chemical shift anisotropy, in which case the sample 410 is spun about axis 106 at the magic angle θ of 54.7° (or 54° 44') from the direction of the $B_0$ field (i.e., from the direction along the Z-axis). As appreciated by persons skilled in the art, such spinning components include a rotor 412, which may the same structure responsible for retaining sample 410 at the magic angle or may be a separate component. Other spinning-related components are indicated collectively as a drive assembly 414 in FIG. 4, and may include a stator, mechanical or air bearings between the stator and rotor 412, a gas-driven turbine for driving rotor 412, a tachometer or encoder, and any other suitable associated drive and control components. Sample probe 330 may also include gradient coils (not shown) that produce controlled gradients in the $B_0$ field along the X-, Y-, and Z-axes for such purposes as gradient-enhanced NMR spectroscopy, diffusion measurements, or NMR microscopy. Sample probe 330 may further include components (not shown) for controlling the temperature of sample 410 during an experiment, which is useful in variable-temperature (VT) techniques.

Sample probe 330 may include a tunable circuit 332 that comprises sample coil 310 in communication with electronics for tuning sample coil 310 to one or more desired resonance conditions and matching sample coil 310 with other impedances of the RF circuitry to maximize RF power transfer. A simplified equivalent circuit could be drawn in which sample coil 310 is represented by an inductor, a variable capacitor for tuning adjustment is in parallel with the inductor, and another variable capacitor for matching adjustment is in series between the inductor and a node communicating with RF transmitting circuitry 350 and RF receiving circuitry 360 of the NMR apparatus 300 (FIG. 3). Tunable circuit 332 may be integrated within the body of sample probe 330 and may be physically proximate to the sample, but preferably is situated remotely enough that it does not impair the performance of any spinning components included with sample probe 330. Sample coil 310 having the scroll structure may be multi-tunable to support circuitry configured for multiple-resonance (e.g., double-resonance, triple-resonance, quad-resonance or, more generally, n-resonance) experiments. Hence, tunable circuit 332 may be embodied in separate channels H, F, X, Y, . . . n, with each channel being essentially independently matched and tuned for properly transferring the RF energy at a frequency required for exciting a specific nucleus of sample. By convention, H designates a high-frequency channel for exciting a $^1H$ nucleus (a proton), F designates a lower-frequency (yet still relatively high frequency) channel for exciting a $^{19}F$ nucleus, and X and Y designate lower-frequency channels for exciting nuclei having lower gyromagnetic ratios (e.g., $^{13}$C and $^{31}$P).

Figure 5:
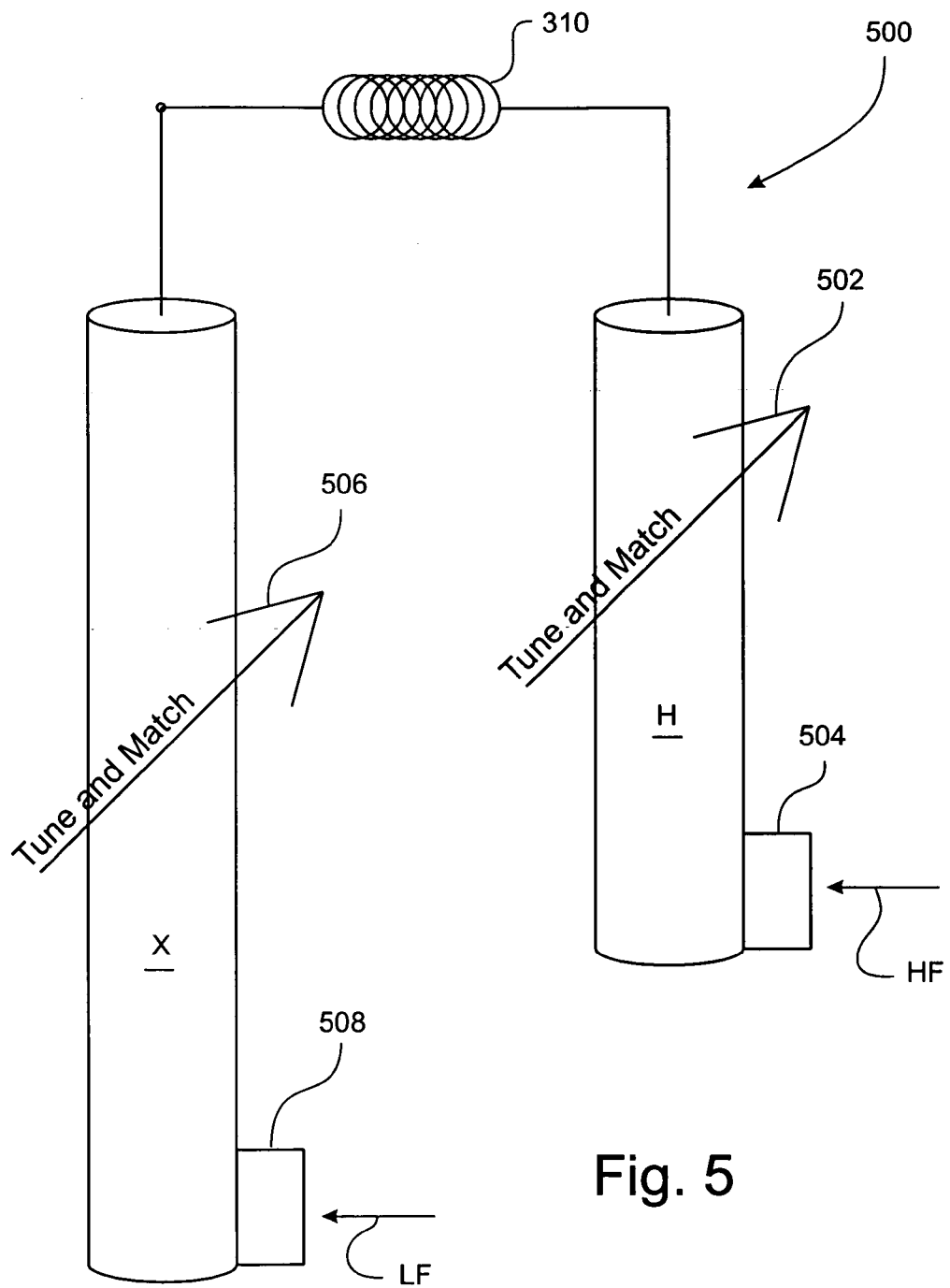
FIG. 5 is a schematic diagram representative of an example of a double-resonance RF circuit of which the scroll coil as illustrated in FIGS. 1A–1D or FIG. 2 can form a part.
Figure 6:
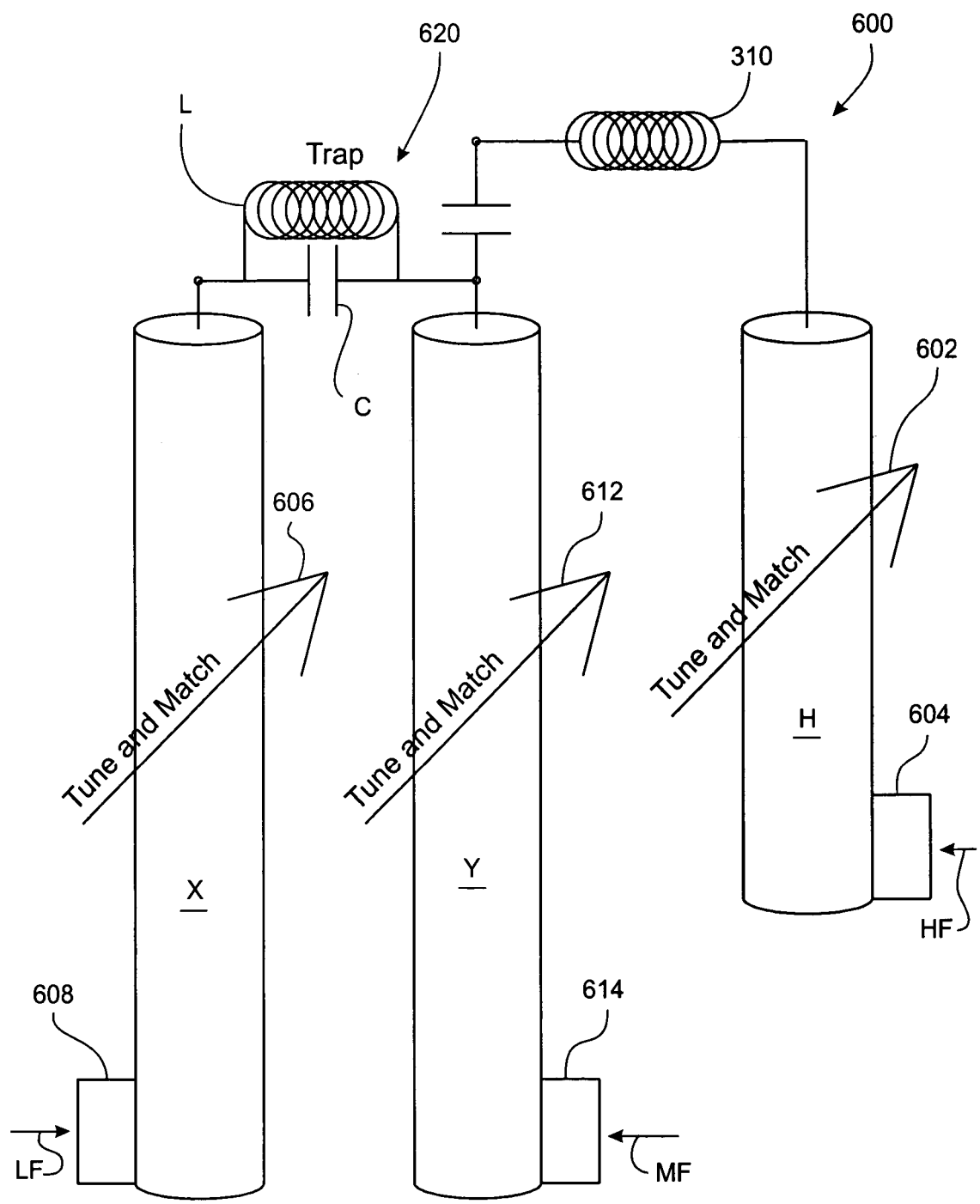
FIG. 6 is a schematic diagram representative of an example of a triple-resonance RF circuit of which the scroll coil as illustrated in FIGS. 1A–1D or FIG. 2 can form a part.

Simplified schematic diagrams of a double-resonance (e.g., HX) circuit 500 and triple-resonance (e.g., HXY) circuit 600 are illustrated in FIGS. 5 and 6, respectively. In FIG. 5, sample coil 310 communicates with a high-frequency (H) channel and a low-frequency (X) channel. The H channel includes tuning and matching circuitry generally represented by an arrow 502 to indicate its adjustability, and a port 504 for receiving a high-frequency input HF. As one example, port 504 may be a connector that couples with an RF transmission line such as a 50-Ω coaxial cable. The X channel includes tuning and matching circuitry generally represented by an arrow 506 and a port 508 for receiving a low-frequency input LF. In FIG. 6, sample coil 310 communicates with a high-frequency (H) channel and a low-frequency (X) channel that include tuning/matching circuitry 602, 606 and LF and HF ports 604, 608, respectively. Sample coil 310 additionally communicates with a mid-frequency (Y) channel that includes tuning and matching circuitry 612 and a port 614 for receiving a mid-frequency input MF. Depending on the configuration of a multiple-resonance circuit such as triple-resonance circuit 600, one or more trap circuits, tank circuits, or the like may be needed to isolate one channel from another. As shown by way of example in FIG. 6, a trap circuit 620 is illustrated simply as a parallel LC circuit.

It will be understood that double-resonance circuit 500 of FIG. 5 and triple-resonance circuit 600 of FIG. 6 can provide platforms on which to build additional channels. It will be further understood that various arrangements and combinations of circuit elements can be provided to implement the functions of the RF channels illustrated in FIGS. 4–6. Hence, any further details regarding double-resonance circuit 500, triple-resonance circuit 600, or other multiple-resonance circuits are readily known to persons skilled in the art and need not be specified in this disclosure. For purposes of this disclosure, more significance attaches to the ability to provide a sample coil 310, having a scroll configuration as illustrated for scroll coil 100 in FIGS. 1A–1D or scroll coil 200 in FIGS. 2A–2C, which can be multi-tuned to support the operation of multi-resonance circuits. With multi-tunability, a wide variety of known magnetic resonance-based procedures can be carried out with the use of sample coil 310 on both liquid and solid samples. The use of the scroll geometry enables the investigation of a larger class of sample types due to reduced sample heating and other advantages stated elsewhere in this disclosure.

In conjunction with the multiple-resonance circuitry, sample coil 310 in its multiple-tuned scroll configuration can be driven to excite different types of NMR-active nuclei, either concurrently as in multinuclear experiments or during different time periods. Nuclei of different types encompass any nuclei having different resonance frequencies, not only heteronuclear spin species (e.g., $^1$H and $^{13}$C) but also homonuclear spin species that are chemically non-equivalent due to their differing, local chemical environments and thus resonate at different frequencies. In a given experiment, a channel may serve as an observe channel for exciting nuclear species to obtain a response signal, or the channel may be used for saturating or decoupling selected nuclei such as in homonuclear spin decoupling, heteronuclear spin decoupling, or dipolar decoupling in accordance with a variety of well-known techniques. A channel may be configured for broadband tuning or selective tuning among frequencies (e.g., switchable between $^1$H and $^{19}$F frequencies).

It thus can be seen that sample coil 310 configured with the scroll geometry is compatible with a wide variety of multi-pulse, multi-resonance, and multi-dimensional magnetic resonance-based techniques. A few examples of applications of sample coil 310 are briefly summarized below with the understanding that the examples constitute a non-exhaustive list of potential applications for sample coil 310.

A sample probe 330 as described above equipped with a sample coil 310 as described above (e.g., scroll coil 100 in FIGS. 1A–1D and scroll coil 200 in FIGS. 2A–2C) may be employed in conjunction with well-known cross polarization techniques, such as in a case where the spin-lattice relaxation times for certain nuclei (e.g., $^{13}$C) would otherwise be undesirably long (particularly in solid samples). In one non-limiting example of a typical cross polarization experiment, a pulse sequence is applied to cause magnetization from sensitive (or source) nuclei (S) of a high gyromagnetic ratio $\gamma_S$ such as protons to be transferred to insensitive nuclei (I) of a relatively low gyromagnetic ratio $\gamma_I$ such as $^{13}$C. In effect, the respective Larmor frequencies of the S and I nuclei become identical according to the Hartman-Hahn condition $\gamma_S B_1^{(S)} = \gamma_I B_1^{(I)}$. In solid-state NMR experiments, the cross polarization technique can be advantageously employed with the MAS technique (CP-MAS) and further with dipolar decoupling. A CP-MAS experiment employing sample probe 330 equipped with sample coil 310 may further be enhanced by performing a rotor-synchronized CP-MAS technique, as disclosed for example in U.S. Pat. No. 5,170,120, assigned to the assignee of the present disclosure. In such a case, sample probe includes a tachometer (not shown) to encode the position of its rotor. The tachometer generates a pulsed timing signal representative of the measured rate at which the rotor spins. This timing signal is fed to one or more channels of sample probe 330 being employed to apply cross polarization. As a result, the signal employed for the cross polarization effect is pulsated at a repetitive rate synchronized with the angular velocity of the rotor. Cross polarization techniques can be useful in connection with multi-dimensional NMR experiments.

A sample coil 310 can be employed in a sample probe 330 in a suitable NMR apparatus 300 such as described above (FIG. 3) to perform various multi-dimensional experiments (e.g., 2D and 3D). A 2D NMR experiment, for instance, typically yields a spectrum that is a contour plot in which the intensity of the peaks is plotted as a function of two frequencies (e.g., $F_1$ and $F_2$) or two chemical shift parameters (e.g., $\delta_1$ and $\delta_2$). The detected signal is recorded as a function of two time variables, $t_1$ and $t_2$, and then Fourier-transformed twice to yield a spectrum that is a function of two frequency variables. Particularly in the case of solid-state NMR, the general pulse sequence is usually described as containing a preparation period, followed by an evolution period of duration $t_1$, followed by a mixing period, and followed by a detection period of duration $t_2$. During the preparation period, nuclei of a given type (e.g., $^1$H) in the sample are excited by one or more RF pulses to a non-equilibrium state. During the evolution period, the resulting magnetization is allowed to evolve for the first time period $t_1$. During the mixing period, another set of one or more RF pulses are applied, usually to cause the transfer of coherence or polarization from the excited nuclei to the nuclei of another type (e.g., $^{13}$C). During the detection period, a signal such as the FID signal from the second type of nuclei is recorded as a function of the second time interval $t_2$. During the detection period, decoupling RF energy may be applied to the first type of nuclei to suppress homonuclear and/or heteronuclear interactions. The nuclear spins are then allowed to return to equilibrium, $t_1$ is set to a different value, the sequence is repeated, and the resulting data are stored separately from that of the first sequence. The sequence is repeated for increasing values of the evolution interval $t_1$ until sufficient data have been recorded. Examples of well-known multi-dimensional NMR techniques that can be executed with the use of sample coil 310 include, but are not limited to, homonuclear J-resolved, heteronuclear J-resolved, EXSY (exchange spectroscopy) or NOESY (nuclear Overhauser effect, or enhancement, spectroscopy), COSY (homonuclear correlated spectroscopy) and its variants (e.g., DQF COSY or double-quantum filtered COSY and TQF COSY or triple-quantum filtered COSY), HETCOR (heteronuclear correlated spectroscopy), HMQC (heteronuclear multiple-quantum correlation), HSQC (heteronuclear single-quantum correlation), 2D counterparts of INEPT (insensitive nuclei enhanced by polarization transfer), DEPT (distortionless enhanced polarization transfer), and INADEQUATE (incredible natural abundance double quantum transfer experiment), and variants and combinations of these processes. Sample coil 310 can also be used to study membrane transport proteins by conducting a solid-state 2D, 3D, 4D, 5D PISEMA (polarization inversion spin exchange at the magic angle) experiment that operates on $^1H$ and $^{15}N$ nuclei to yield a 2D spectrum consisting of distinctive wheel-like patterns known as PISA (polarity index slant angle) wheels.

Experimental Results

Scroll coils having geometries as illustrated for scroll coil 100 in FIGS. 1A–1D and scroll 200 in FIGS. 2A–2C were tested and compared with a standard solenoid coil. The results of these tests show that the homogeneity of the RF magnetic field applied by the scroll coil is far superior to that of the solenoid coil at both high (e.g., $^1H$) and low (e.g., X) frequencies. As discussed below, RF field plots show that the scroll coil is 85% homogeneous axially from end to end of the coil whereas the solenoid is only 60% homogeneous. The RF field intensity of the solenoid is greater at the center but lower at the ends, whereas the scroll coil has a consistent field throughout the active sample region. The scroll coil was tested in double-resonance mode with the lower frequency set to approximately 10% of the higher frequency and exhibited excellent (nearly 100%) field overlap between the $^1H$ and X frequencies. Moreover, it was found that folding the edges of the scroll coil adjusts the RF field by increasing the volume of the coil because of increased spacing between the coil wraps, thereby reducing field strength at the center of the coil. On the other hand, folding the edges does not affect field strength at the ends of the coil, and thus folding can improve overall axial homogeneity in the active sample region. Furthermore, the RF field overlap among different resonant frequencies and the homogeneity are unchanged by changing the radius of the coil. For example, maintaining the coil length at 6 mm and varying the diameter from 2.5 mm to 5 mm offered nearly 100% $^1H$-X overlap and 80% axial RF homogeneity for all coils tested.

Figure 7:
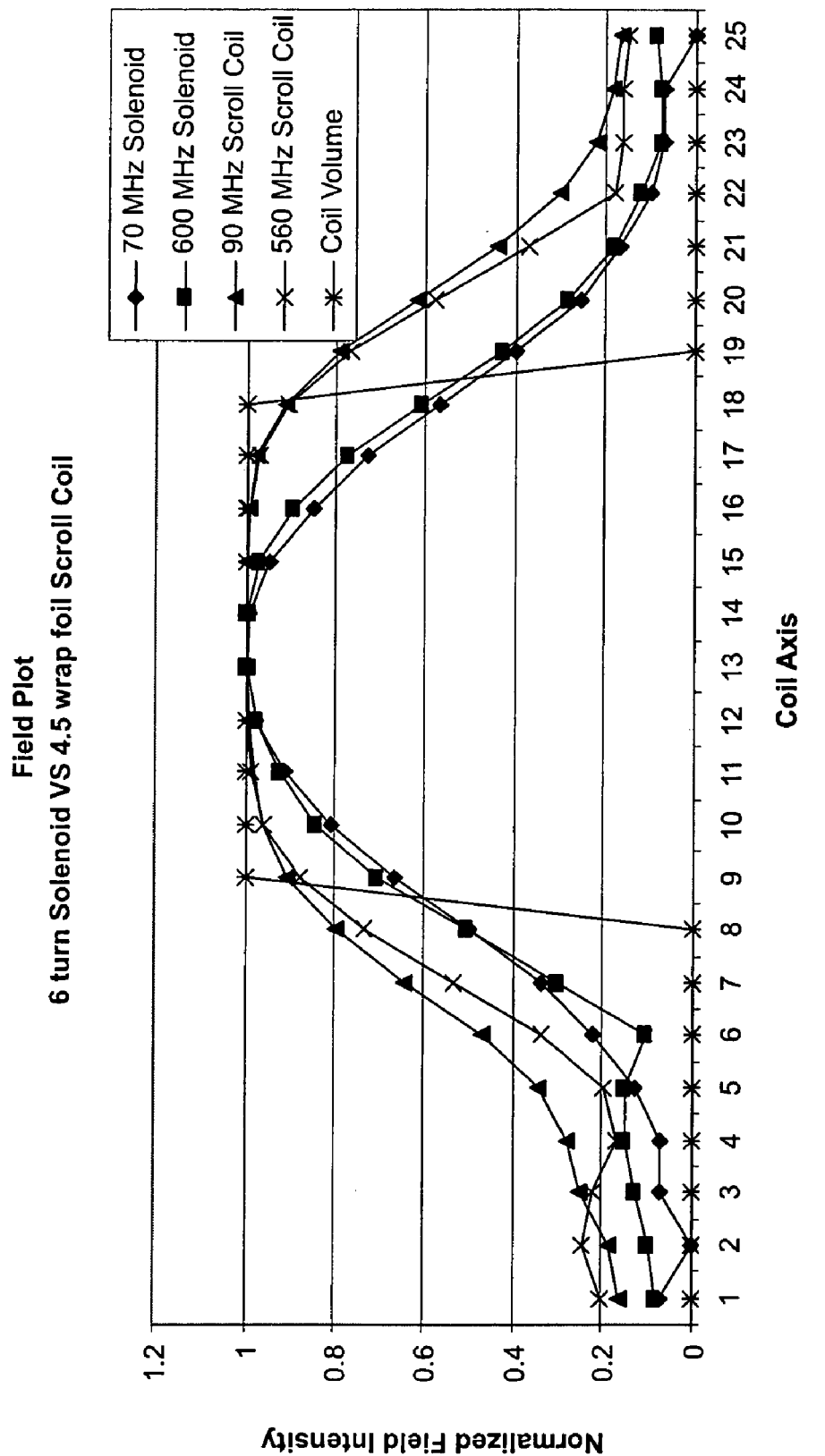
FIG. 7 is a plot of normalized RF magnetic field intensity as a function of position along the axis of various comparatively tested coils.

FIG. 7 is a plot of normalized RF magnetic field intensity as a function of position along the axis of various comparatively tested coils. The solenoid coil tested had a 6-turn configuration, and the scroll coil tested had a 4.5-wrap configuration. As indicated by the legend included with the field plot, tests were conducted on a solenoid coil tuned to a low frequency (70 MHz) and a high frequency (600 MHz), and on a scroll coil tuned to a low frequency (90 MHz) and a high frequency (560 MHz). A curve indicating the profile/volume of the coils, and particularly the axial ends of the coil volume, is superposed on the field plots to aid in interpretation. FIG. 7 demonstrates that the RF homogeneity of the scroll coil is far superior to that of the solenoid coil at both high and low frequencies. Specifically, FIG. 7 shows that the scroll coil is 85% homogeneous from end to end of the coil whereas the solenoid coil is only 60%.

Figure 8:
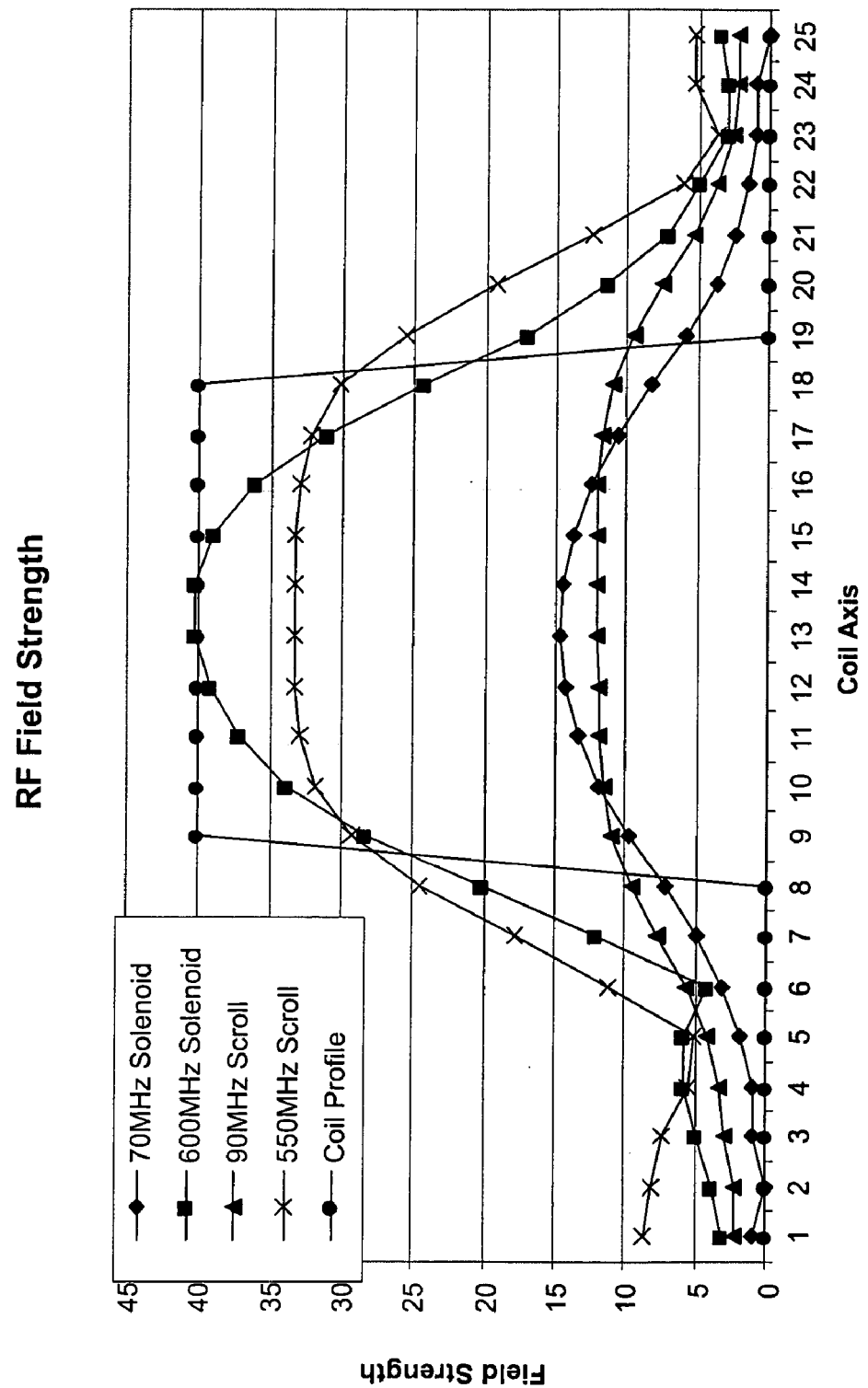
FIG. 8 is a plot of RF field strength as a function of position along the axis of the coils tested.

FIG. 8 is a plot of RF field strength as a function of position along the axis of the coils tested. As indicated by its legend, FIG. 8 provides comparative data for coils of solenoid and scroll geometry at both high and low frequencies. FIG. 8 demonstrates that the RF field strength of the solenoid coil is 17% higher in the center region of its volume but falls 20% lower at the ends of its volume, whereas the field strength of the scroll coil is much more consistent throughout the axial dimension.

Figure 9:
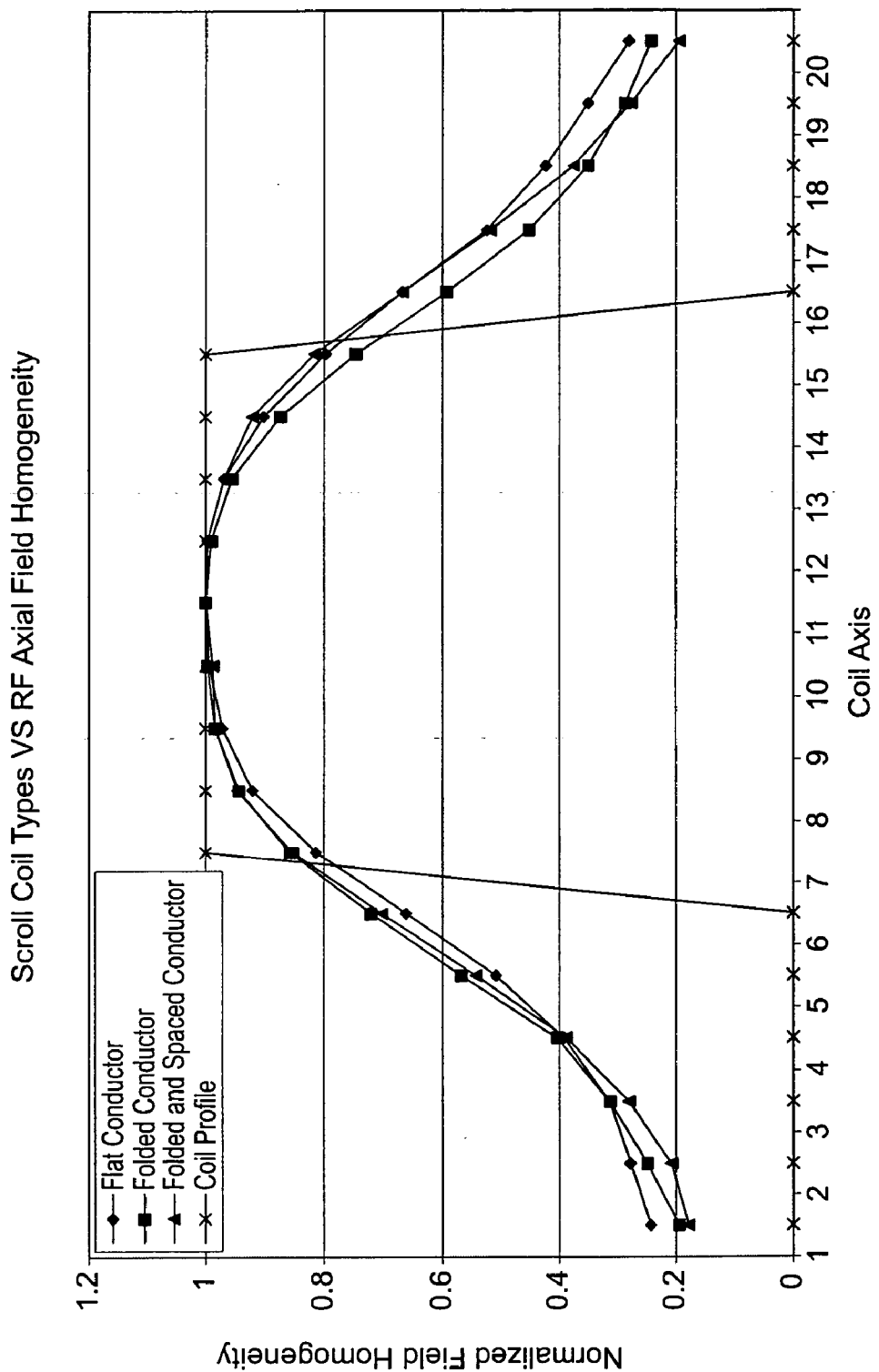
FIG. 9 is a plot of normalized RF magnetic field intensity as a function of position along the axis of various configurations of scroll coils.
Figure 10:
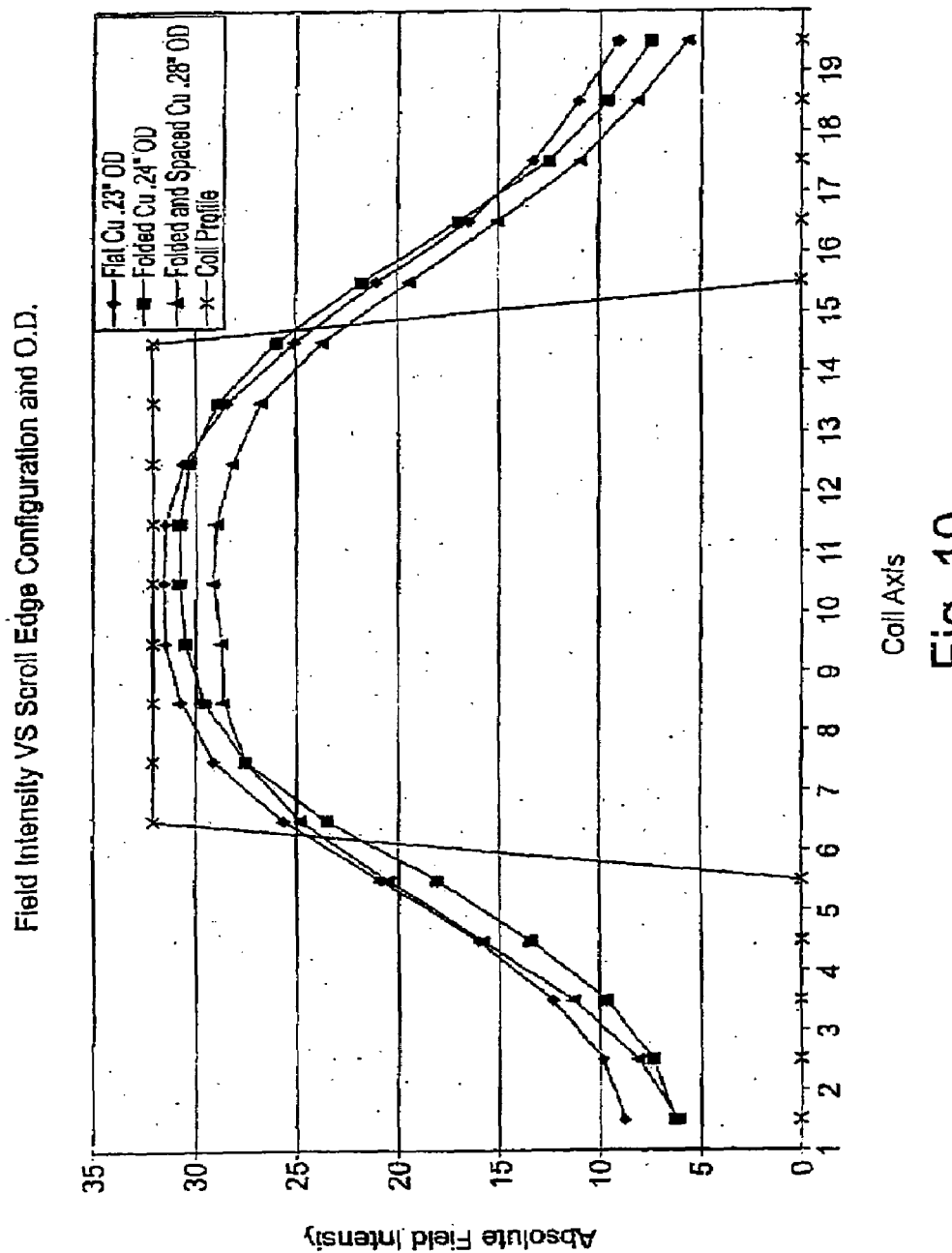
FIG. 10 is a plot of absolute RF magnetic field intensity as a function of position along the coil axis.

FIGS. 9 and 10 illustrate the effects of folding the edges of the scroll coil. FIG. 9 is a plot of normalized RF magnetic field intensity as a function of position along the axis of various configurations of scroll coils, and FIG. 10 is a plot of absolute RF magnetic field intensity as a function of position along the coil axis. Specifically, scroll coils having a flat conductor configuration, a folded conductor configuration, and a folded and spaced conductor configuration (referring to the previously described implementation in which an air gap exists between the folded portion and the remaining portion of the material) were tested. FIG. 9 demonstrates that folding the edges of the scroll coil increases the axial RF homogeneity by approximately 5%. The folded edges locally increase the RF field at the ends of the coil, thereby flattening the field profile inside the coil and improving the RF field homogeneity. On the other hand, FIG. 10 demonstrates that folding the edges of the scroll coil in effect reduces the RF field strength by approximately 10% due to increased coil volume with a greater reduction in the center of the coil by increasing the distance between the wraps at the center. With the edges folded, the outer diameter of the scroll coil is increased from 0.24 inch to 0.28 inch. The inner diameter was maintained at 0.165 inch.

Figure 11:
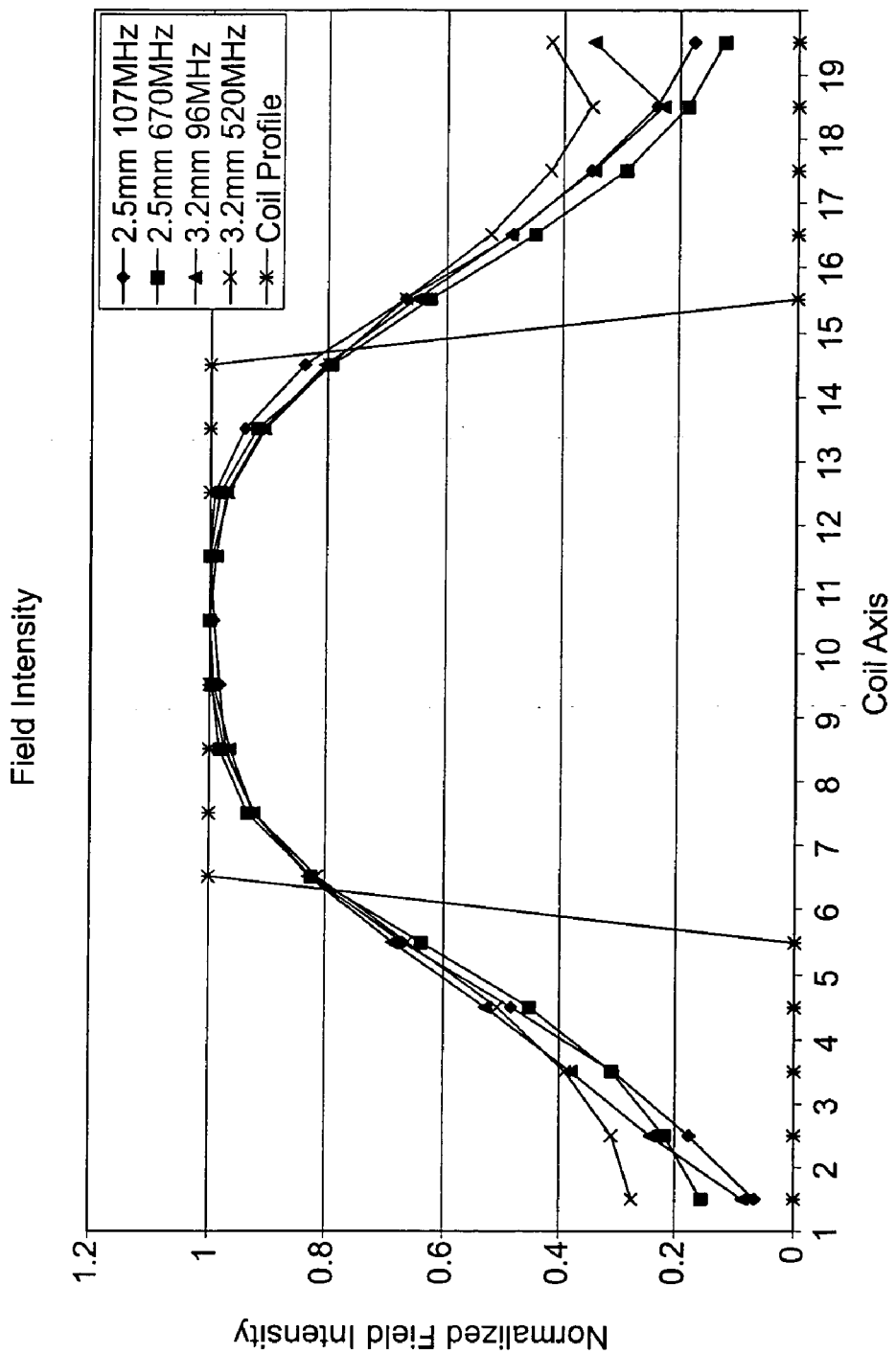
FIG. 11 is a plot of RF magnetic field strength as a function of position along the axis of various scroll coils.

FIG. 11 is a plot of RF magnetic field strength as a function of position along the axis of two scroll coils of different diameters to show the effect on RF homogeneity due to changing the ratio of coil diameter to coil length. Each coil has a length of 0.215 inch. A 2.5-mm coil was tested at low frequency (107 MHz) and high frequency (670 MHz), and a 3.2-mm coil was tested at low frequency (96 MHz) and high frequency (520 MHz). As is common in the industry, the values 2.5 mm and 3.2 mm are actually the outer diameter of the sample holder (e.g., a sample tube or, in this case, the rotor that spins the sample). The inside diameters of the coils themselves are about 0.5 mm greater than the outer diameter of the sample holder. The effect of changing the ratio of coil diameter to coil length is small; for both coil diameters the normalized field intensity is 85% of the maximum at the ends of the coils. The normalized plot shows that there is virtually no change in the RF homogeneity profile when changing the coil length to diameter ratio from 2.2 to 1.7.

It will be understood that apparatus, devices and methods disclosed herein can be implemented in an NMR apparatus or system as generally described above, for which one non-limiting example is illustrated in FIG. 3. The components generally depicted in FIG. 3 typically relate to an NMR spectrometer. The present subject matter, however, is not limited to NMR spectroscopy, but rather may extend to any apparatus or system that could benefit from the advantages provided by the scroll coils and associated sample probes described above. Other applications include, but are not limited to, NMR microscopy (e.g., micro-imaging) and larger-scale imaging (e.g., MRI). Moreover, while exemplary implementations have been described above primarily in the context of applications with Fourier transform (FT) NMR spectrometers, the subject matter may be extended to other types of NMR spectrometers such as continuous wave (CW) NMR spectrometers. Furthermore, while exemplary implementations have been described above primarily in the context of applications with high-resolution NMR spectrometers, the subject matter may be extended to other NMR spectrometers more typically considered as being lower-resolution NMR spectrometers such as wide-line NMR spectrometers. Typically, such lower-resolution NMR spectrometers operate with the polarizing magnetic field $B_0$ having a strength on the order of a few tenths of a Tesla.

It will be further understood that various aspects or details of the invention may be changed without departing from the scope of the invention. Furthermore, the foregoing description is for the purpose of illustration only, and not for the purpose of limitation the invention being defined by the claims.

What is claimed is:

1. A sample probe configured for magnetic resonance experiments, comprising:
   (a) a coil simultaneously tunable to at least two different frequencies and comprising
      a section of the coil having a scroll configuration defined by: two axial ends;
      at least one planar body of an electrically conductive material wrapped about a central longitudinal axis with one or more turns or wraps, of the electrically conductive material, circumferentially extending about the coil axis and longitudinally extending between the two axial ends;
      a first conductive lead element adjoined to an innermost turn or wrap of the electrically conductive material; and
      a second conductive lead element adjoined to an outer turn or wrap of the electrically conductive material;
      the scroll configuration also defining a core into which a sample can be inserted; and
   (b) a multi-resonant circuit communicating with the conductive lead elements of the scroll configuration coil, in order to transmit RF energy into the coil at two or more different frequencies in order to excite nuclei of the sample.

2. The probe according to claim 1, comprising a device spinning the sample about an axis of the sample which is defined to be the sample axis.

3. The probe according to claim 2, comprising a structure configured for holding the sample in an orientation in which the sample axis is at an angle with respect to the direction of an applied static magnetic field.

4. The probe according to claim 3, comprising a device configured for spinning the sample about the sample axis while the sample is held at the angle.

5. The probe according to claim 3, wherein the angle is the conventional magic angle of 54.7 degrees (54 degrees 44').

6. The probe according to claim 1, wherein the multi-resonant circuit is configured for transmitting a sequence of one or more signals which are operative to induce cross polarization between at least two nuclei of the sample.

7. The probe according to claim 1, wherein the two or more different frequencies comprise at least one frequency, which excites a proton.

8. The probe according to claim 7, wherein the two or more different frequencies comprise at least one frequency, which excites a $^{13}C$ nucleus.

9. The probe according to claim 8, wherein the two or more different frequencies comprise at least a third frequency, which excites a nucleus having a gyromagnetic ratio between the gyromagnetic ratio of a proton and the gyromagnetic ratio of a $^{13}C$ nucleus.

10. The probe according to claim 7, wherein the two or more different frequencies comprise at least one frequency, which excites a nucleus having a gyromagnetic ratio between the gyromagnetic ratio of a proton and the gyromagnetic ratio of a $^{13}C$ nucleus.

11. The probe according to claim 1, wherein the section of the coil having the scroll configuration comprises a layer of material axially extending from a first edge region, through a central region, and to a second edge region, and the layer has a greater thickness in the edge regions than in the central region.

12. A magnetic resonance apparatus comprising:
   (a) a coil simultaneously tunable to at least two different frequencies and including:
      a section of the coil having a scroll configuration defined by:
         two axial ends;
         at least one planar body of an electrically conductive material wrapped about a central longitudinal axis with one or more turns or wraps, of the electrically conductive material, circumferentially extending about the coil axis and longitudinally extending between the two axial ends;
         a first conductive lead element adjoined to an innermost turn or wrap of the electrically conductive material; and
         a second conductiye lead element adjoined to an outer turn or wrap of the electrically conductive material; the scroll configuration also defining a core into which a sample can be inserted;
   (b) RF transmission circuitry communicating with the conductive lead elements of the scroll configuration coil, which transmits RF energy into the coil at two or more different frequencies simultaneously, in order to provide an excitation of the two or more different frequencies to the nuclei of the sample; and
   (c) RF receiving circuitry communicating with the conductive lead elements of the coil and configured for receiving an RF signal responsive to the excitation.

13. The apparatus according to claim 12, comprising a sample probe, which is configured for containing the sample, wherein the coil is housed in the sample probe.

14. The apparatus according to claim 13, wherein the sample probe further comprises a multi-resonant circuit tunable to the two or more different frequencies and functionally communicates with the RF transmission circuitry.

15. The apparatus according to claim 12, further comprising circuitry configured for producing a frequency-domain spectrum based on the received RF signal.

16. The coil according to claim 12, wherein the scroll coil configuration itself forms a multi-resonance circuit with at least one input of RF energy configured for exciting multiple nuclei of the sample requiring different resonance conditions and the at least one input also being configured for an absorption of the RF energy provided in the excitation.

17. The coil according to claim 12, wherein the wrapped electrically conductive material of the scroll section includes a layer of the electrically conductive material axially extending from a first edge region, through a central region, and to a second edge region, with the layer having a greater thickness in the edge regions than in the central region, because the layer is folded in the edge regions in order to give the greater thickness.

18. The coil according to claim 17, wherein the layer is continuously wrapped around the defined core a plurality of times in order to define a plurality of wraps or turns circumferentially extending around the defined core, and the layer having greater thickness in the edge regions along each wrap.

19. The coil according to claim 18, wherein the first and second conductive lead elements are formed from the continuously wrapped layer of material employed in creating the scroll configuration section of the coil.

* * * * *